United States Patent [19]

Tomomura et al.

[11] Patent Number: 4,988,579
[45] Date of Patent: Jan. 29, 1991

[54] ELECTROLUMINESCENT DEVICE OF COMPOUND SEMICONDUCTOR

[75] Inventors: Yoshitaka Tomomura; Masahiko Kitagawa, both of Nara, Japan

[73] Assignee: Sharp Kabushiki Kaisha, Osaka, Japan

[21] Appl. No.: 382,237

[22] Filed: Jul. 19, 1989

[30] Foreign Application Priority Data

Jul. 21, 1988 [JP] Japan ................................ 63-182664
Sep. 26, 1988 [JP] Japan ................................ 63-240556

[51] Int. Cl.⁵ ............................................ H01L 33/00
[52] U.S. Cl. .................................. 428/690; 313/506; 357/17
[58] Field of Search .................. 428/690, 901; 357/17; 313/503, 506, 512, 509

[56] References Cited

U.S. PATENT DOCUMENTS

| | | | |
|---|---|---|---|
| 3,975,661 | 8/1976 | Kanatani et al. | 357/17 |
| 4,634,934 | 1/1987 | Tohda et al. | 313/503 |
| 4,868,615 | 9/1989 | Kamata | 357/17 |
| 4,916,496 | 4/1990 | Tomomura et al. | 357/17 |

Primary Examiner—James Seidleck
Attorney, Agent, or Firm—Cohen, Pontani & Lieberman

[57] ABSTRACT

The present invention provides an electroluminescent device of Group II-14 VI compound semiconductor which comprises a substrate, a light-emitting portion, and a conductive portion provided at least between the substrate and the light-emitting portion for injecting into the light-emmitting portion the current to be produced in the device by the application of an external voltage.

21 Claims, 8 Drawing Sheets

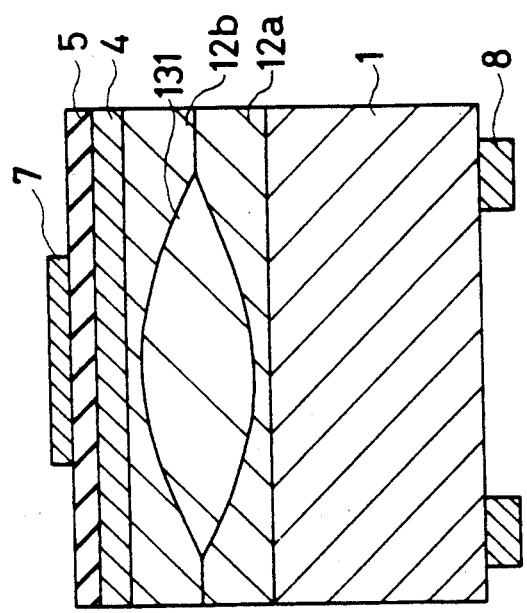
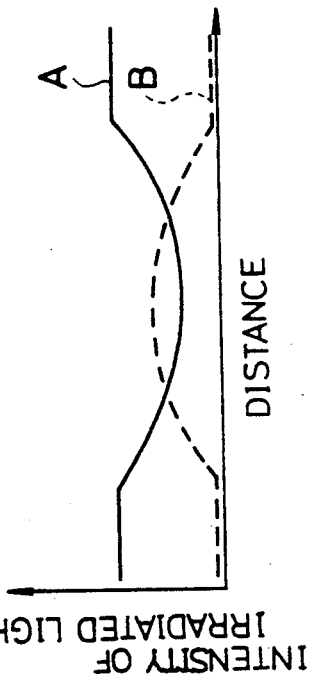
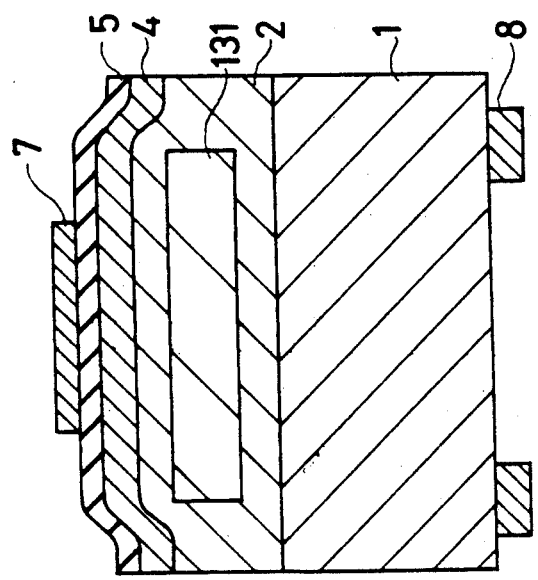

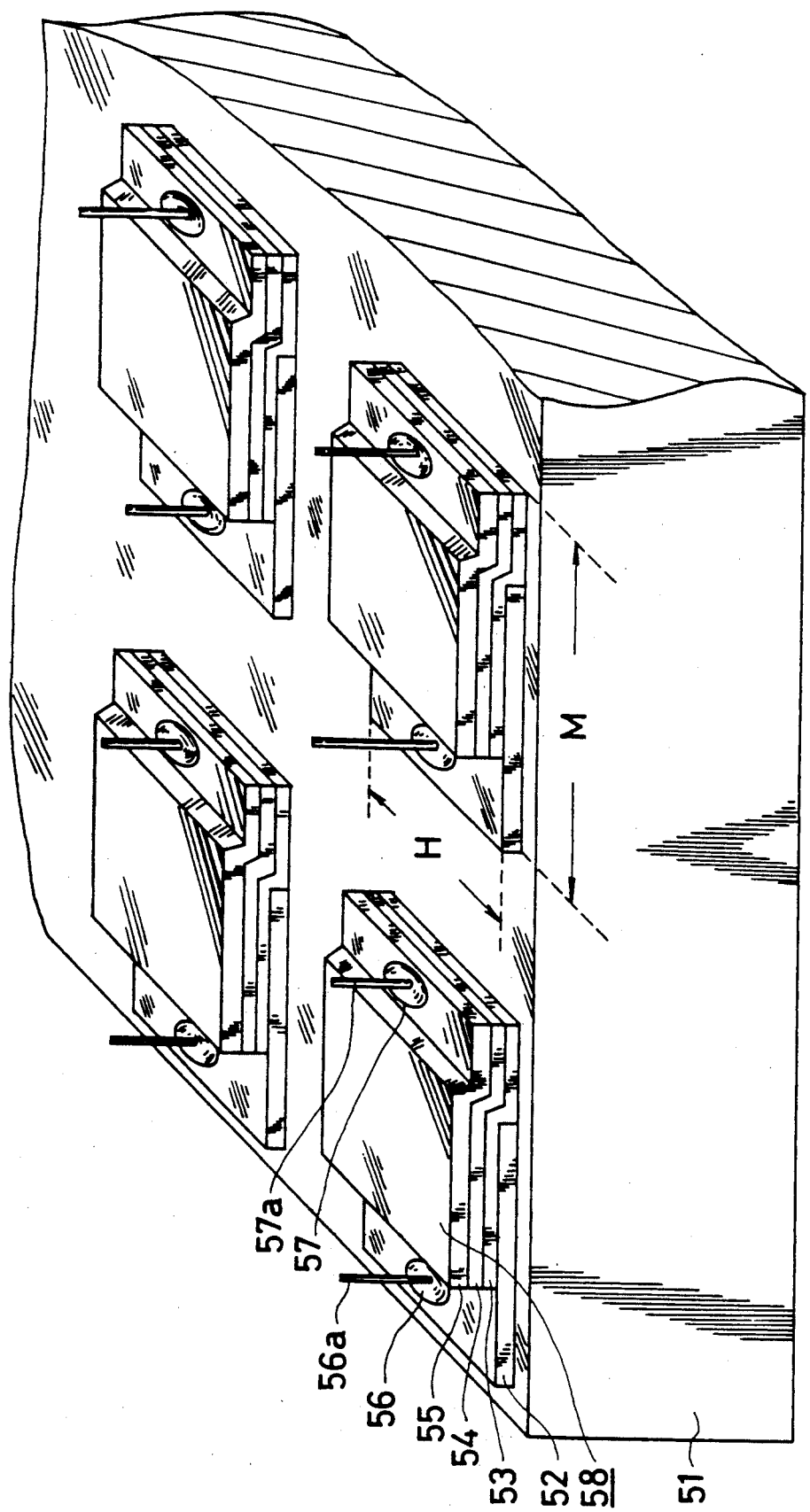

ELECTROLUMINESCENT DEVICE OF COMPOUND SEMICONDUCTOR

BACKGROUND OF THE INVENTION

1. Field of the Invention

The present invention relates to electroluminescent devices of compound semiconductor, and more particularly to improvements in electroluminescent devices comprising a Group II - VI compound semiconductor such as zinc sulfide (ZnS) or zinc selenide (ZnSe).

2. Description of the Prior Art

Group II - VI compound semiconductors such as ZnS and ZnSe are generally used as materials for devices, such as blue light-emitting diodes, for producing light with high efficiency over the region of ultraviolet rays to visible rays.

FIG. 14 shows an example of structure conventionally used for electroluminescent devices of such a Group II - VI compound semiconductor. Indicated at 71 is a low-resistance n-type ZnS single-crystal substrate prepared from a ZnS bulk single crystal grown by the halogen chemical transport process, by heat-treating the crystal in molten zinc at 1000° C. for 100 hours. A light-emitting layer 74 of n-type ZnS and an insulating layer 75 of insulating ZnS are successively formed epitaxially over the substrate 71 by molecular beam epitaxy (MBE) or organometallic chemical vapor deposition (MOCVD). Gold (Au) is deposited on the insulating layer 75 by vacuum evaporation to form a positive electrode 77. An ohmic electrode of indium (In) serving as a negative electrode 78 is formed on the rear surface of the low-resistance n-type substrate 71. Thus, a MIS (metal insulator semiconductor) electroluminescent device is fabricated.

Also known is an electroluminescent device wherein a conductive layer is provided between a substrate and a light-emitting layer.

With reference to FIG. 15, the known device comprises a low-resistance n-type ZnS substrate 83 having a resistivity of 10 to 1 ohm-cm and a thickness of 300 to 1000 $\mu$m, a low-resistance n-type ZnS conductive layer 84 having a resistivity of $10^{-2}$ to $10^{-3}$ ohm-cm and epitaxially formed over the substrate 83, for example, by MBE from ZnS with Al, Cl or the like added thereto, a low-resistance n-type ZnS light-emitting layer 85 and a ZnS high-resistance layer 86 which are formed successively over the layer 84, for example, by MBE, an ohmic electrode 82 formed on the rear surface of the substrate 83 by depositing In thereon by vacuum evaporation and heat-treating the deposit in a high-purity gas atmosphere at 450° C. for several seconds to several minutes, an electrode 87 formed on the high-resistance ZnS layer 86 by depositing Au thereon by vacuum evaporation, and lead wires 81 and 88 suitably arranged.

With these conventional electroluminescent devices, the current injected via the electrodes 77, 78 or 82, 88 flows through the device over a wide region, so that the current density in the light-emitting layer 74 or 85 is small. This makes it difficult to obtain luminescence with high brightness. Furthermore, the light produced by the emitting layer 74 or 85 radiates through the device in every direction. It is therefore likely that the light produced will not be taken out of the device efficiently.

Either one of the foregoing constructions of electroluminescent devices may be used for fabricating a monolithic display device which comprises a multiplicity of minute luminescent chips having a unit size of 100 $\mu$m and prepared by forming a minute discrete pattern on the substrate. When current is passed through the device, a majority of current loss occurs in the substrate. It is therefore likely that the device is high in the series resistance of the chips and has an impaired insulating property between the chips.

An object of the present invention, which has been accomplished in view of the foregoing situation, is to provide an electroluminescent device of Group II - VI compound semiconductor adapted to produce light with high brightness.

SUMMARY OF THE INVENTION

The present invention provides an electroluminescent device of compound semiconductor which comprises an electroluminescent device body formed on a substrate and providing a light-emitting portion and a conductive portion joined to the lower surface and/or the upper surface of the light-emitting portion, and a pair of electrodes for applying therethrough an external voltage to the body to cause electroluminescence, the conductive portion comprising a conductive layer formed of a Group II - VI compound semiconductor made to have a substantially low resistance by the addition of an impurity element, and a conductive layer part provided in the conductive layer and formed of a Group II - VI compound semiconductor having a higher refractive index than the Group II - VI compound semiconductor of the conductive layer and containing an impurity element added thereto, the conductive layer part being so shaped as to confine thereto the light produced by the light-emitting portion.

Thus, the present invention provides an electroluminescent device of Group II - VI compound semiconductor which comprises a substrate, a light-emitting portion, and a conductive portion provided at least between the substrate and the light-emitting portion for injecting into the light-emitting portion the current to be produced in the device by the application of an external voltage. The conductive portion comprises a conductive layer formed of a Group II - VI compound semiconductor made to have a substantially low resistance by the addition of an impurity element, and a conductive layer part provided in the conductive layer and formed of a Group II - VI compound semiconductor having an impurity element added thereto. The Group II - VI compound semiconductor used for forming the conductive layer part is made to have a higher refractive index than the semiconductor forming the conductive layer. Consequently, the light produced by the light-emitting portion can be confined to the layer part having the higher refractive index and delivered from the device efficiently with high brightness.

The conductive layer part, when shaped, for example, in the form of a lens, renders the light produced by the emitting portion convergent or directional, making it possible to deliver the light from the device toward a specified direction more efficiently.

BRIEF DESCRIPTION OF THE DRAWINGS

FIG. 1 is a diagram showing the structure of a first embodiment of the invention;

FIG. 2 is a diagram showing the structure of second embodiment of the invention;

FIG. 3 is a diagram showing the intensity distribution of irradiated light as used for forming the electroluminescent device of the second embodiment;

FIG. 13 is a fragmentary perspective view of an electroluminescent display having a large area and incorporating a plurality of electroluminescent devices, each of the devices having a pair of electrodes on its body.

DESCRIPTION OF THE PREFERRED EMBODIMENTS

Figure 4:
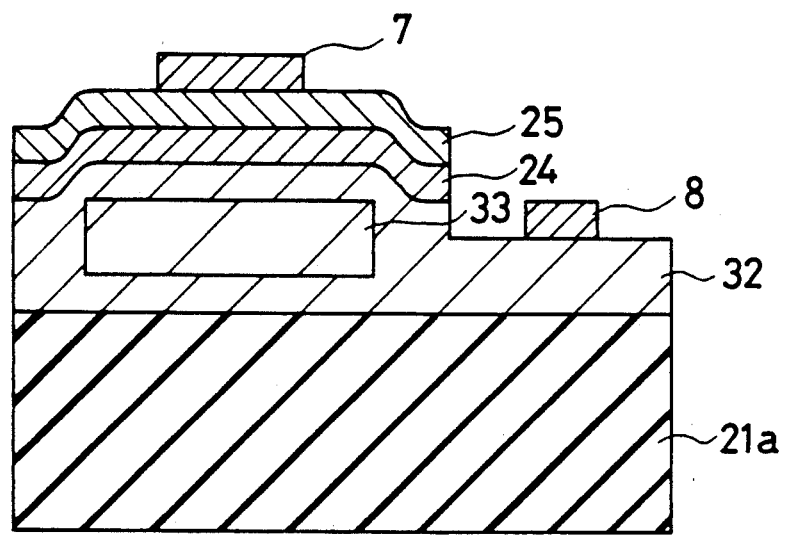
FIGS. 4 to 8 are diagrams showing the structures of third to seventh embodiments of the invention, respectively.

The electroluminescent device of the present invention is prepared from a Group II - VI compound semiconductor. The light emitted by the light-emitting portion by the application of a voltage across the electrodes has a multiplicity of colors including blue and appears on the upper surface or lower surface of the device. The device is used as a light source having high energy and high brightness for various displays, printers, facsimile systems, etc.

The greatest structural feature of the electroluminescent device of the present invention is that the conductive portion joined to the lower surface and/or the upper surface of the light-emitting portion comprises a conductive layer (hereinafter referred to as the "first conductive layer") and a conductive layer part (hereinafter referred to as the "second conductive layer") provided in the first conductive layer, and that the Group II - VI compound semiconductor forming the second conductive layer has a higher refractive index than the semiconductor forming the first conductive layer.

The substrate for use in the invention is preferably made of a Group II - VI compound semiconductor. Examples of such semiconductors are low-resistance n-type ZnS, low-resistance n-type ZnSe, low-resistance n-type $ZnS_xSe_{1-x}$ and the like, and insulating ZnS, insulating ZnSe, insulating $ZnS_xSe_{1-x}$ and the like.

For example, the substrate of low-resistance n-type ZnS (or low resistance n-type ZnSe or low-resistance n-type $ZnS_xSe_{1-x}$) is prepared from a ZnS bulk single crystal (or ZnSe bulk single crystal or $ZnS_xSe_{1-x}$ bulk single crystal) grown by the halogen chemical transport process, by heat-treating the single crystal in molten zinc at 1000° C. for about 100 hours. The substrate thus obtained is made to have a low resistance. Preferably, the above materials forming the substrate have the following resistivities (ohm-cm).

ZnS: 1 to 10, more preferably about 1.
ZnSe: $10^{-2}$ to 10, more preferably about 1.
$ZnS_xSe_{1-x}$ 1 to 10, more preferably about 1.

Examples of n-type impurities useful for the heat treatment in preparing the substrates are Al, Ga and the like, Cl and Br. Also usable are In, I and the like.

For preparing the substrate of insulating ZnS (or insulating ZnSe or insulating $ZnS_xSe_{1-x}$) it is desirable to use a ZnS bulk single crystal (or ZnSe bulk single crystal or $ZnS_xSe_{1-x}$ bulk single crystal) as it is without subjecting the crystal to low-resistance treatment.

When the $ZnS_{0.5}Se_{0.5}$ crystal is used which is grown by the halogen chemical transport process or high-pressure melting process, the substrate obtained is colored yellow or orange and is low in transparency for the luminescence wavelength, so that the blue light produced, for example, needs to be taken out from the semiconductor side. However, if the $ZnS_{0.5}Se_{0.5}$ crystal is used which is grown by the sublimation process, the resulting substrate is almost colorless and transparent and is desirable since blue light emitted can be taken out also from the substrate side. The substrate to be used in this case need not be subjected to the low-resistance treatment conventionally employed, but the wafer obtained from a bulk single crystal can be used as it is, i.e., with its high resistivity (with insulating to semi-insulating property, $10^6$ to $10^{15}$ ohm-cm).

The light-emitting portion to be formed in the present invention is preferably an n-type ZnS light-emitting layer providing a ZnS electroluminescent device of the MIS (metal insulator semiconductor) type, or a light-emitting layer having a p-n junction provided by the combination of n-type ZnSe and p-type ZnSe for constituting a p-n junction electroluminescent device of the planar structure type.

In the case of the MIS-type electroluminescent device, the Group II - VI compound semiconductor for the light-emitting layer is not limited to ZnS; also usable is, for example, ZnSe, $ZnS_xSe_{1-x}$ or $ZnS_yTe_{1-y}$. When the light-emitting layer is of the p-n junction type, use of ZnSe p-n junction is not limitative; also usable are ZnS p-n junction, $ZnS_xSe_{1-x}$ p-n junction, $ZnS_yTe_{1-y}$ p-n junction, p-n heterojunctions afforded by such materials, and various other junctions.

According to the present invention, the first conductive layer which is made to have a substantially low resistance by the addition of impurity means one having a resistivity of 1 to $10^{-2}$ ohm-cm. This resistivity is controllable by setting the concentration of impurity added to $10^{16}$ to $10^{18}$ cm$^{-3}$, whereby the electric resistance is settable to the range useful for electroluminescent devices.

According to the invention, the conductive portion comprises an n-type first conductive layer formed on a Group II - VI compound semiconductor, such as ZnS, ZnSe or $ZnS_xSe_{1-x}$, having substantially low resistance, and an n-type second conductive layer provided in the first layer and formed of a Group II - VI compound semiconductor different in kind or composition from the semiconductor of the first layer and having a higher refractive index than the semiconductor of the first conductive layer. ZnS and ZnSe are 2.4 and 2.7, respectively, in refractive index. $ZnS_xSe_{1-x}$, which is a mixed crystal of these, is controllable in refractive index between the above values by varying the S content (x) thereof. It is desirable that the second conductive layer have a higher refractive index than the first. For this purpose, it is desired to make the sulfur (S) content (x) of the second conductive layer at least about 0.5 greater than that of the first conductive layer.

Preferably, the first and second conductive layers is $10^{18}$ to $10^{19}$ cm$^{-3}$ in electron concentration and as low as $5 \times 10^{-2}$ to $5 \times 10^{-3}$ in resistivity. Further preferably, the second conductive layer is lower than the first in resistivity.

Figure 6:
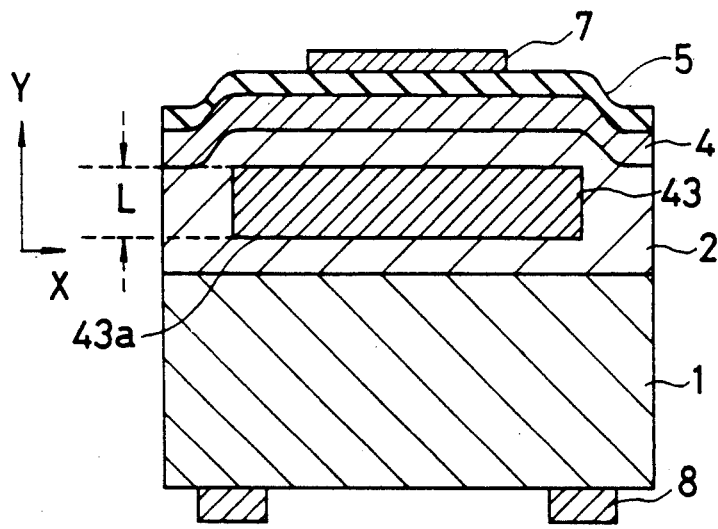
Figure 7:
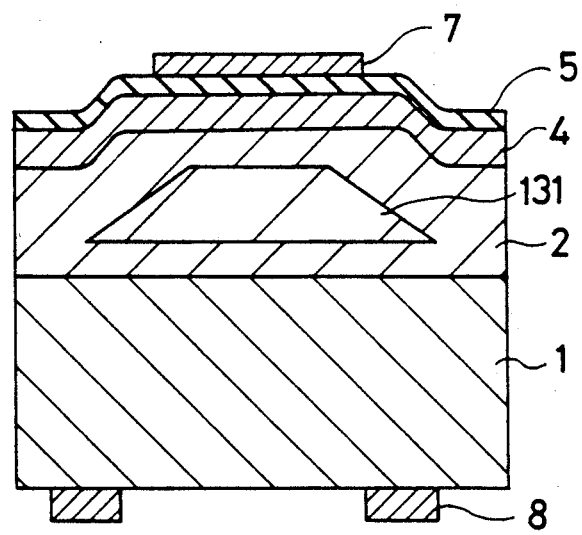

The second conductive layer is in the form of a solid cylinder (see FIGS. 1, 4, 5 and 6) or a Fresnel lens including a convex lens (see FIGS. 2 and 8), or is trapezoidal in section (see FIG. 7). When the device (chip) is, for example, 300 μm×300 μm in size, the cylindrical layer is about 30 to about 100 μm in diameter and about 5 to about 20 μm in thickness (preferably 10 μm).

The composition of the second conductive layer may be uniform or may vary continuously or stepwise from each of the upper and lower interfaces between the first and second conductive layers toward the center of the second widthwise thereof (see FIG. 6).

Examples of n-type impurities for use in preparing the first and second conductive layers and the light-emitting layer are elements from Group III such as boron (B), aluminum (Al), gallium (Ga), indium (In) and thallium (Tl), and elements from Group VII such as chlorine (Cl), bromine (Br), fluorine (F) and iodine (I). At least one of these elements is used, or at least one of such elements from Group III is used in combination with at least one of these elements from Group VII. On the other hand, examples of useful p-type impurities are elements from Group Ia such as lithium (Li), sodium (Na), potassium (K), rubidium (Rb) and cesium (Cs), the elements from Group Ib, i.e. copper (Cu), silver (Ag) and Gold (Au), thallium from Group III and elements from Group V such as nitrogen (N), phosphorus (P), arsenic (As), antimony (Sb) and bismuth (Bi). At least one of these elements is used, or at least one of the above elements from Group Ia or Ib is used in combination with at least one element from Group V. These impurities are suitable for giving epitaxial films which are small in the degree of compensation and have a high quality.

According to the invention, epitaxial compound semiconductor layers are formed one over another on the compound semiconductor substrate to form the body of an electroluminescent device. To be suitable, the device body usually measures 50 to 500 μm in width, 80 to 800 μm in length and 2 to 15 μm in thickness. The device body may be formed singly on the substrate, or a multiplicity of device bodies can be formed in a scattered arrangement to provide a monolithic electroluminescent display or a large-area electroluminescent display. FIG. 13 shows a monolithic electroluminescent display including compound semiconductor electroluminescent devices 58 each having an insulating ZnSe substrate 51, an electroluminescent device body formed on the substrate 51 and comprising a p-type ZnSe conductive layer 52, a p-type ZnSe light-emitting layer 53, an n-type ZnSe light-emitting layer 54 and an n-type ZnSe conductive layer 55 (a conductive layer portion provided in the conductive layer 55 and having a higher n-type impurity concentration than the layer 55 is not shown, the same as hereinafter) which are formed one over another, an Au positive electrode 56 provided on the conductive layer 52, and an In negative electrode 57 provided on the conductive layer 55 forming the uppermost layer of the device body. Indicated at 56a and 57a are lead wires. The device 58 on the substrate measures 450 μm in width H and 750 μm in length M. The display has 24×24 electroluminescent devices as arranged separately from one another in the form of a matrix. An arrangement of such displays provides a large-area electroluminescent display apparatus.

Figure 9:
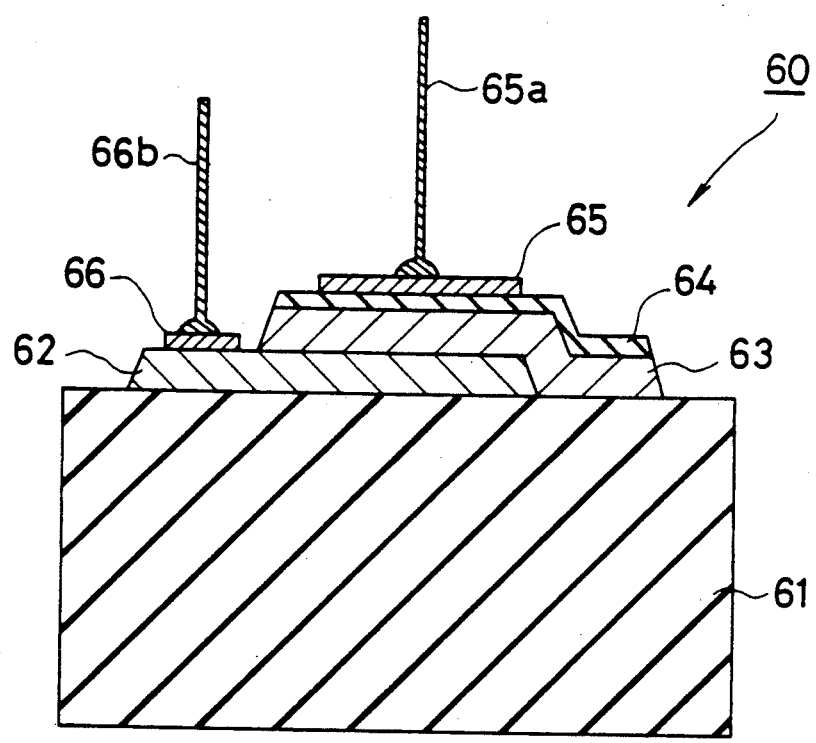
FIGS. 9 and 10 are diagrams showing the structures of electroluminescent devices each having a pair of electrodes on the body of the device.

FIG. 9 shows a MIS-type electroluminescent device 60 having a high-resistance layer formed on a light-emitting layer. More specifically, the device 60 comprises an insulating ZnS substrate 61, a device body formed on the substrate and having an n-type ZnS conductive layer 62 and an n-type ZnS light-emitting layer 63 on the layer 62, a ZnS high-resistance layer 64 formed on the light-emitting layer 63, an Au positive electrode 65 provided on the layer 64, and an In negative electrode 66 provided on the conductive layer 62. Indicated at 65a and 66a are lead wires.

Figure 10:
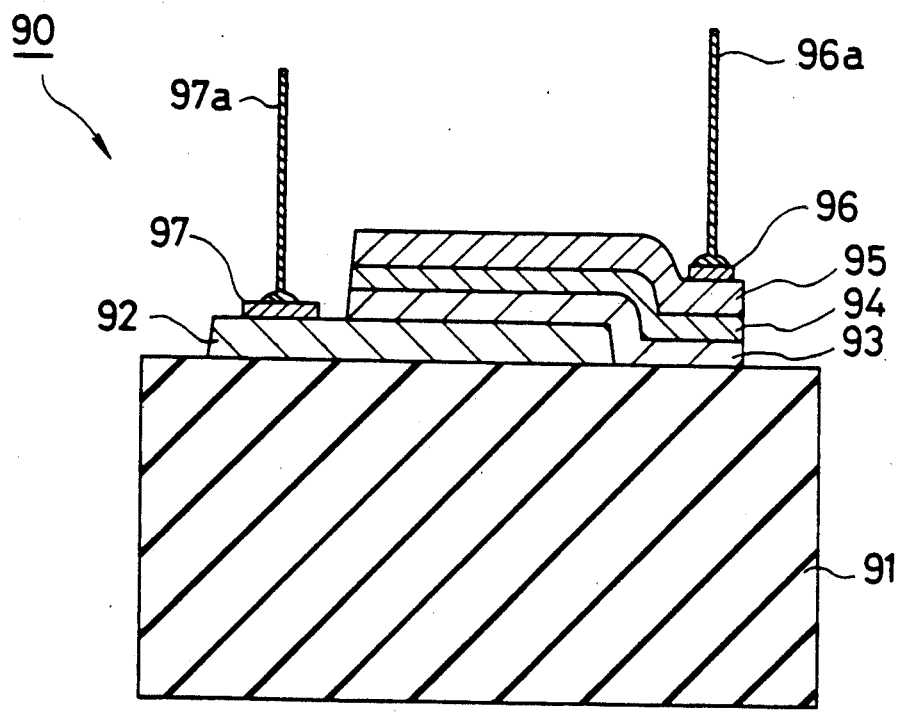

FIG. 10 shows an electroluminescent device 90 of the p-n junction type. The device 90 comprises an insulating ZnSe substrate 91, a device body formed on the substrate and comprising an n-type ZnSe conductive layer 92, an n-type ZnSe light-emitting layer 93, a p-type ZnSe light-emitting layer 94 and a p-type ZnSe conductive layer 95 which are formed one over another, an Au positive electrode 96 provided on the conductive layer 95, and an In negative electrode 97 provided on the conductive layer 92. Indicated at 96a and 97a are lead wires.

With the devices shown in FIG. 9 and 10, the electrode 66, 65 or 97, 96, like the electrodes 56, 57 of FIG. 13, are arranged respectively in an electrode forming space on the conductive layer and on the uppermost layer of the device body (on the conductive layer 55 in FIG. 13, on the high-resistance layer 64 in FIG. 9, or on the conductive layer 95 in FIG. 10) for applying a voltage therethrough to the device body.

When the electrodes are thus provided on the device body, the voltage which would otherwise be applied via the substrate can be efficiently applied to the device body. This precludes the loss due to the substrate to result in the following advantages.

(1) The reduced resistance between the electrodes makes it possible to provide a compound semiconductor electroluminescent device free of a loss and having high brightness.

(2) Monolithic electroluminescent displays and large-area electroluminescent displays can be provided which comprise a multiplicity of minute electroluminescent chips arranged on a substrate with satisfactory insulation between the chips and reduced series resistance for producing multicolor light including blue light.

Such a compound semiconductor electroluminescent device is fabricated by placing a mask having a specified rectangular aperture on a high-resistance compound semiconductor substrate, for example of $10^6$ to $10^{15}$ ohm-cm, forming a low-resistance semiconductor conductive layer as the lowermost layer first on the substrate, and forming a compound semiconductor light-emitting layer, and a compound semiconductor high-resistance layer or a compound semiconductor conductive layer as superposed layers on the resulting conductive layer except at an electrode forming site. The layers are formed, for example, by MBE. Depending on how the mask is handled, the device is prepared in this way by one of the following two processes.

The first of the processes comprises placing a mask of thin metal film having at least one specified rectangular aperture on the compound semiconductor substrate, epitaxially growing a compound semiconductor conductive layer first as the lowermost layer, then shifting the mask so as to cover the electrode forming site on the layer with the mask, forming a compound semiconductor light-emitting layer on the conductive layer, further epitaxially growing a compound semiconductor high-resistance layer or compound semiconductor conductive layer on the light-emitting layer to obtain a device body, removing the mask and thereafter providing electrodes at the electrode forming site on the lowermost conductive layer and on the surface of the uppermost high-resistance layer or conductive layer.

The second process comprises placing a mask of thin metal film having at least one specified rectangular aperture over the compound semiconductor substrate at a specified distance (which is usually 10 to 500 μm to be suitable) away therefrom, epitaxially growing a compound semiconductor conductive layer first, then altering the angle of inclination of the substrate provided with the mask (generally suitably by 5 to 45 degrees) with respect to the direction of projection of the molecular beam to mask an electrode forming site on the conductive layer, forming a compound semiconductor light-emitting layer on the conductive layer, further epitaxially growing a compound semiconductor high-resistance layer or compound semiconductor conductive layer on the resulting layer to obtain a device body, removing the mask and providing electrodes at the electrode forming site on the lowermost conductive layer and on the surface of the uppermost high-resistance layer or conductive layer.

The electroluminescent device body thus obtained comprises epitaxial compound semiconductor layers which are all identical in shape when seen from above. It is suitable that the electrode forming site on the lowermost layer be usually 5 to 80% of the surface of the lowermost layer in area.

The processes described above are very useful for epitaxially forming compound semiconductor layers. Moreover, the use of a high-resistance compound semiconductor, especially bulk single crystal, as it is for the compound semiconductor substrate as already described and shown in FIGS. 13, 9 and 10 facilitates separation of unit electroluminescent devices which are to be obtained collectively in the form of a single chip.

Figure 11:
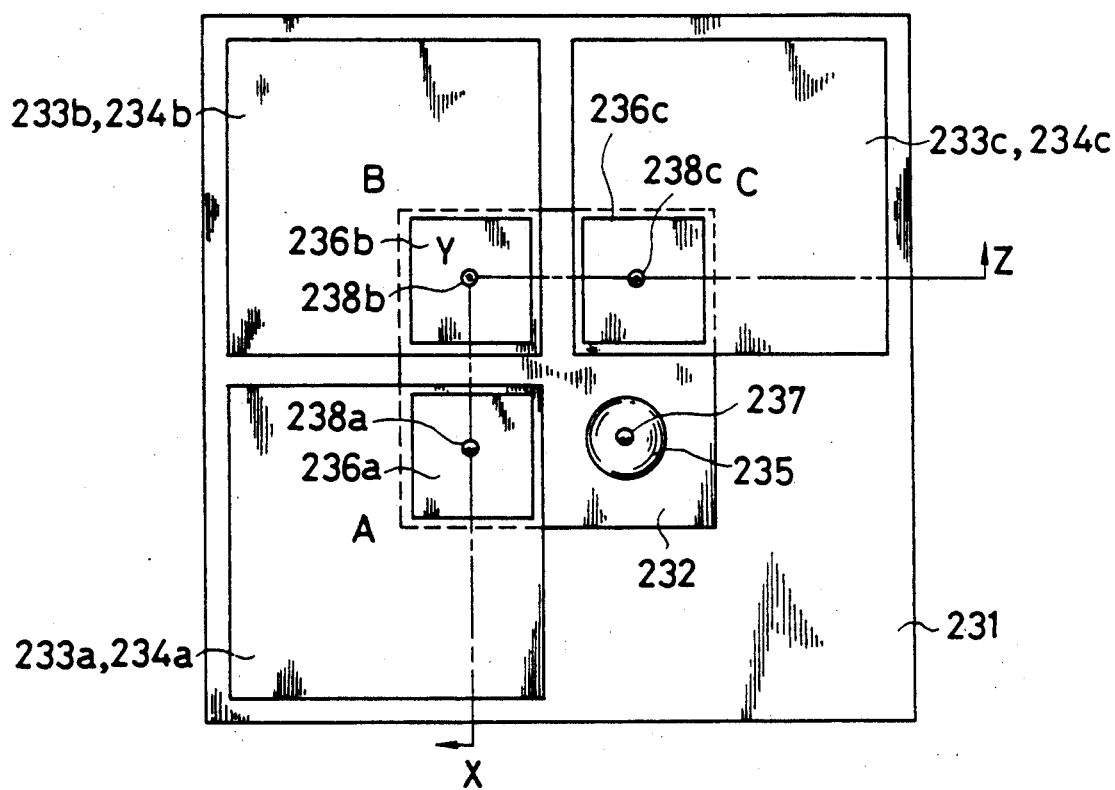
FIG. 11 is a diagram showing the structure of a plurality of electrodes on the body of the device.
Figure 14:
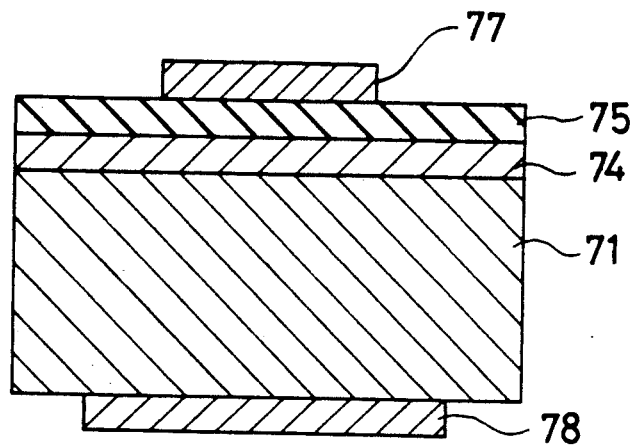
FIG. 14 and 15 are diagrams showing the structures of conventional devices.
Figure 15:
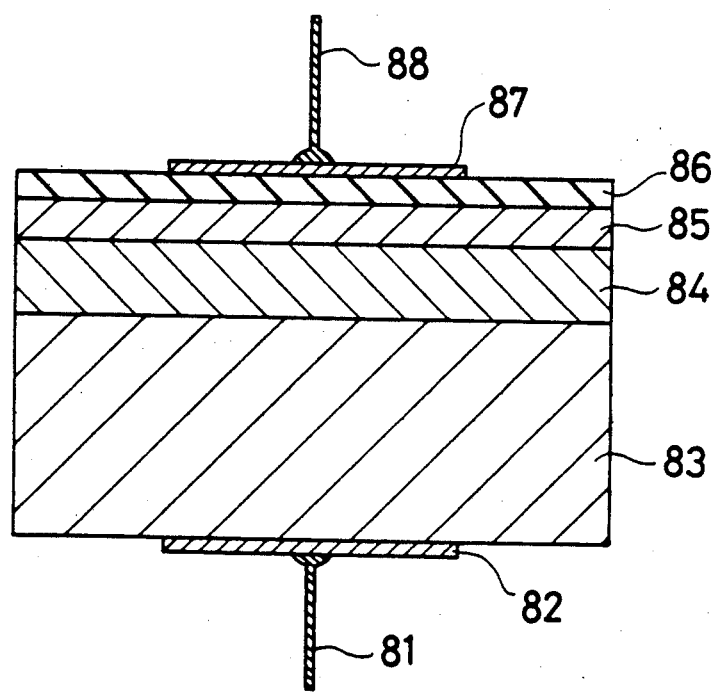
Figure 12:
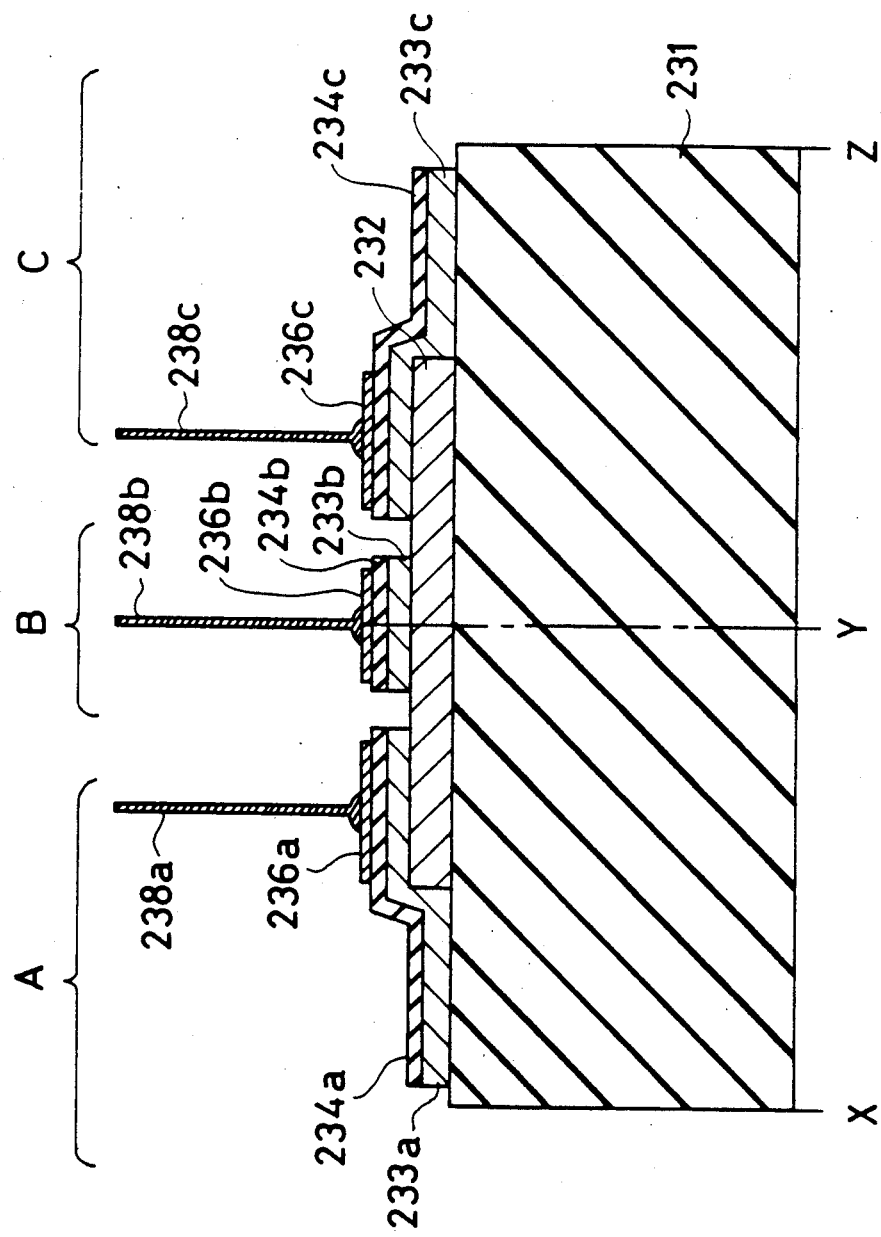
FIG. 12 is a view in section taken along the line X-Y-Z in FIG. 11.

Finally, FIGS. 11 and 12 show a ZnS multicolor electroluminescent device of the MIS-type similar to the one shown in FIG. 9. With reference to FIGS. 11 and 12, the device comprises a semi-insulating (high-resistance) ZnS substrate 231, a low-resistance n-type epitaxial ZnS conductive layer 232, low-resistance n-type epitaxial ZnS light-emitting layers 233a, 233b, 233c, hole injecting epitaxial ZnS high-resistance layers 234a, 234b, 234c, an ohmic metal (In) electrode 235 formed on the conductive layer 232, metal (Au) electrodes 236a, 236b, 236c formed on the respective high-resistance layers 234a, 234b, 234c and metal lead wires 237, 238a, 238b, 238c. This device is prepared by placing a mask of thin metal plate having a rectangular aperture on the semi-insulating (high-resistance) ZnS substrate 231, growing the conductive layer 232 by MBE, thereafter growing the light-emitting layer 233a and the high-resistance layer 234a in overlapping relation with the conductive layer 232 by MBE with the mask shifted to form a light-emitting portion A, similarly forming light-emitting portions B and C in succession with the mask further shifted, and providing the electrodes 235, 236a, 236b and 236c. The device thus formed includes the three light-emitting portions A, B and C having the conductive layer 232 in common. The light-emitting layers of the respective light-emitting portions have added thereto as impurities Al and Ag at about one-tenth the concentration of Al, Al and Cu at about one-tenth the concentration of Al, and Al and cadmium (Cd) at one-half the concentration of Al, respectively.

When voltage was applied to the respective light-emitting portions of the device obtained, blue, green and red luminescences were observed with high brightness. Multicolor light was produced by controlling the voltage to be applied to the three light-emitting portions.

According to the present invention, the second conductive layer is formed during the growth of the first conductive layer by locally irradiating the grown layer, for example, with an ArF excimer laser beam at a wavelength of 193 nm, whereby impurities are added at a high concentration to the irradiated portion of the grown layer, consequently forming a region having an impurity concentration which is greater than that of the non-irradiated portion by about one order of magnitude. This region provides the second conductive layer.

FIG. 1 shows an electroluminescent device as a first embodiment of the invention. Indicated at 1 is a substrate of n-type ZnS single crystal. A low-resistance n-type ZnS layer and a low-resistance n-type zinc sulfoselenide ($ZnS_xSe_{1-x}$) layer are grown on the substrate 1 continuously epitaxially. The alloy layer is then etched away as by chemical etching or reactive ion etching (RIE) except for the portion thereof under the light-emitting portion to be formed. A low-resistance n-type ZnS layer is then grown again to form a first conductive layer 2 of n-type ZnS and a second conductive layer 131 of n-type $ZnS_xSe_{1-x}$ as positioned in the first conductive layer 2. ZnS has a refractive index of 2.4. According to the sulfur (S) content (x), the refractive index of $ZnS_xSe_{1-x}$ continuously varies from the refractive index of ZnS, 2.4, to the refractive index of ZnSe, 2.7. The second layer 131 is higher than the first layer 2 in refractive index. Furthermore, a light-emitting layer 4 of n-type ZnS and an insulating layer 5 of insulating ZnS are formed over the first conductive layer 2. A positive electrode 7 is formed on the insulating layer 5 by depositing Au by vacuum evaporation. An ohmic In electrode serving as a negative electrode 8 is formed on the rear surface of the substrate 1. Thus, a MIS-type electroluminescent device is fabricated.

The semiconductor layers are epitaxially grown by MBE or MOCVD. In fact, each layer was grown by either process with good controllability by varying the amount of material to be fed and changing the material. The ZnS insulating layer can be obtained without addition of impurities. However, if it is likely that high-resistance n-type ZnS will be formed with a low insulating property, highly insulating ZnS can be formed with the addition of at least one of the following impurity elements for forming p-type ZnS, i.e., lithium, sodium, potassium, rubidium and cesium from Group Ia, copper, silver and gold from Group Ib, and nitrogen, phosphorus, arsenic, antimony and bismuth from Group V. At least one of such elements from Groups IA, Ib and V is also usable in combination with at least one of elements from Groups III and VII.

To give reduced electric resistance to the device, the first and second conductive layers 2, 131 are set to a low resistivity (e.g. $5 \times 10^{-2}$ to $5 \times 10^{-3}$ ohm-cm), with their impurity concentration set to about $10^{18}$ to $10^{19}$ cm$^{-3}$. In this case, the second layer 131 is made lower than the first layer 2 in resistivity, thereby permitting current to pass chiefly through the second layer 131 and to flow into the light-emitting layer 4 at a high density, whereby blue light can be produced with high brightness. For the semiconductor $ZnS_xSe_{1-x}$ forming the second layer 131 to have a sufficiently high refractive index relative to the first layer 2, the S content is set to not higher than 0.5. The layer 131 is about 10 μm in thickness so that the light emitted by the emitting layer can be directed toward the substrate efficiently. The portions of the first conductive layer 2 positioned on and beneath the second layer 131 are each about 2 μm in thickness to diminish the strain of each interface between the layers 2 and 131.

For the light-emitting layer 4 to exhibit a high emission efficiency, the layer is formed of n-type ZnS having high crystallinity and a lower electron concentration of about $10^{17}$ cm$^{-3}$ than the conductive layers and is about 1 to about 5 μm in thickness.

The insulating layer 5 has a small thickness of 20 to 700 angstroms to assure the highest current injection efficiency.

The positive electrode 7 is made to have a thickness of 2000 to 3000 angstroms so that the light emitted upward from the emitting layer can be totally reflected toward the substrate. The electrode is positioned immediately above the second conductive layer 131.

The negative electrode 8 is formed in an annular shape so that blue light produced can be delivered from the rear side of the substrate.

With the present embodiment, the light emitted by the emitting layer 4 is confined to the second conductive layer 131 of higher refractive index when passing through the first conductive layer 2 and can be delivered from the substrate side efficiently. Thus, the embodiment realizes a ZnS MIS-type blue electroluminescent device with a delivery efficiency which is one order of magnitude greater than heretofore possible.

According to the present embodiment, a light-emitting layer of p-type ZnS with a hole concentration of $10^{14}$ to $10^{17}$ cm$^{-3}$ can be formed in place of the insulating layer 5 over the light-emitting layer 4 of n-type ZnS. Like the above MIS-type device, the ZnS p-n junction electroluminescent device thus realized achieves a delivery efficiency which is about one order of magnitude greater than is achieved by conventional p-n junction or π-n junction devices.

FIG. 2 shows a second embodiment of the invention, i.e., another ZnS MIS-type electroluminescent device wherein the second conductive layer 131 is in the form of a convex lens. Each of the layers shown is grown by MOCVD using a beam having greater energy than the band gap width of ZnS or $ZnS_xSe_{1-x}$ to be grown, such as an ArF excimer laser beam at a wavelength of 193 nm or monochromatic light released from a xenon lamp having a spectral output of 50 mW/nm/cm$^2$. When the substrate is irradiated with the beam, the contemplated layer can be fully grown even at a low growth temperature (200° to 350° C.) at which little or no growth occurs (not greater than 0.001 μm/h) in the usual case wherein no light is applied. Moreover, the rate of growth is controllable over a wide range of about 0.01 μm/h to about 10 μm/h by varying the intensity of beam.

Stated more specifically, a conductive portion is formed by this beam grown method. First, low-resistance n-type ZnS is grown on a low-resistance n-type ZnS substrate 1 by the application of a beam with an intensity distribution represented by solid line A in FIG. 3, to form the lower segment 12a of a first conductive layer which has a central concave portion and which measures about 2 μm at the central portion and about 7 μm at the end portion in thickness. Subsequently, low-resistance n-type $ZnS_xSe_{1-x}$ is grown by the application of a beam with an intensity distribution represented by broken line B in FIG. 3 to form on the concave portion of the lower segment 12a a second conductive layer 131 resembling a convex lens and having a thickness of about 10 μm at its central portion. Low-resistance n-type ZnS is thereafter grown using the same beam as used for forming the lower segment 12a to form the upper segment 12b of the first conductive layer. An n-type ZnS light-emitting layer 4 and an insulating layer 5 of insulating ZnS are then formed over the first conductive layer thus obtained, followed by the formation of a positive electrode 7 on the insulating layer 5 and a negative electrode 8 on the rear surface of the substrate 1. In this way, a ZnS MIS-type electroluminescent device is fabricated.

With the structure thus obtained, the second conductive layer 131, which has a higher refractive index than the first conductive layer segments 12a, 12b, is in the form of a convex lens, with the result that the light produced by the emitting layer 4 can be rendered convergent and directional and can therefore be delivered from the device toward the desired direction with an improved efficiency.

FIG. 4 schematically shows a third embodiment of the present invention.

With reference to this drawing, an insulating $ZnS_xSe_{1-x}$ substrate 21a is prepared from a $ZnS_xSe_{1-x}$ bulk single crystal grown by the halogen chemical transport process without subjecting the crystal to low-resistance treatment. Formed over the substrate are a first conductive layer 32 of low-resistance n-type $ZnS_ySe_{1-y}$, and a second conductive layer 33 of low-resistance n-type ZnSe having a higher refractive index than the first layer 32.

In this case, $ZnS_ySe_{1-y}$ forming the first conductive layer 32 is given a sulfur content (y) of at least 0.5 so that the second conductive layer has a sufficiently higher refractive index than the first layer 32.

Subsequently formed over the conductive portion are a light-emitting layer 24 of n-type ZnSe and a light-emitting layer 25 of p-type ZnSe. An Au ohmic electrode is formed on the layer 25 as a positive electrode 7. These light-emitting layers are locally etched away to expose the first conductive layer 32, and an In ohmic electrode is provided on the exposed surface as a negative electrode 8. Thus, a p-n junction electroluminescent device is obtained. With this device, the substrate 21a has a wider band gap than the ZnSe light-emitting layers 24, 25 and causes no re-absorption, while the device is of planar structure and therefore has no electrode on the rear side of the substrate 21a. These features permit effective delivery of the light from the device.

Thus, the present embodiment affords a ZnSe p-n junction electroluminescent device which achieves a still improved light delivery efficiency.

Figure 5:
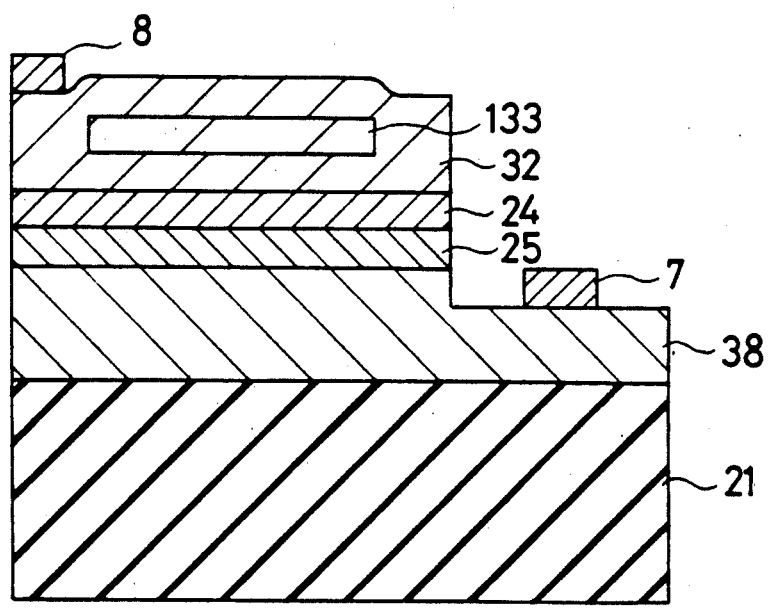

FIG. 5 schematically shows a fourth embodiment of the invention.

With reference to the drawing, an insulating ZnSe substrate 21 is prepared from a ZnSe bulk single crystal grown by the halogen chemical transport process without subjecting the crystal to low-resistance treatment. Epitaxially grown over the substrate 21 are a conductive layer 38 of low-resistance p-type ZnSe, a p-type ZnSe light-emitting layer 25, and an n-type ZnSe light-emitting layer 24. A first conductive layer 32 made of low-resistance n-type $ZnS_ySe_{1-y}$ and having a thickness of 10 μm is thereafter formed, with a second conductive layer 133 of low-resistance $ZnS_kSe_{1-k}$ (k<y) formed in the layer 32. An In negative electrode 8 is formed on the first conductive layer 32. The conductive layer 38 is locally etched away and an Au positive electrode 7 is formed on the exposed surface of the layer 8. A p-n junction electroluminescent device is obtained.

The sulfur content (y) of $ZnS_ySe_{1-y}$ forming the first conductive layer 32 should be greater than $k+0.5$ so that the second conductive layer 133 of $ZnS_kSe_{1-k}$ has a sufficiently higher refractive index than the first conductive layer 32.

With the present embodiment, the first and second conductive layers are formed on or above the light-emitting layers, with the result that the light produced from the emitting layers can be deliverd from the upper surface of the device efficiently.

FIG. 6 shows a fifth embodiment of the invention.

Basically, this embodiment has the same construction as the ZnS MIS-type devices already described except that the second conductive layer 43 is formed of n-type $ZnS_x(l)Se_{1-x}(l)$ (l: distance from the bottom face 43a of the layer 43 toward the direction of its thickness, i.e. direction Y) wherein the sulfur (S) content/selenium (Se) content ratio varies continuously or stepwise in the direction Y.

Stated more specifically, the S content, $x(l)$, of the second conductive layer 43 is so determined that at the interfaces between the layer 43 and the first conductive layer 2 (l=0, l=L, L=thickness of the second conductive layer 43), $x(0)=x(L)=1$, the S content being minimum at the center of the layer 43 (l=L/2). The minimum value $X$ ($X=x(L/2)$) should be smaller than 0.5 so that the second conductive layer 43 has a sufficiently higher refractive index than the first conductive layer 2.

Thus, the composition of the second conductive layer 43 continuously varies from ZnS to $ZnS_xSe_{1-x}$, from each interface between the layers 2 and 43 widthwise of the layer 43. This completely inhibits the defect that would occur at the interface due to the difference in lattice constant between the layers.

The present embodiment realizes electroluminescent devices of the ZnS MIS type or p-n junction type having a high light delivery efficiency.

FIG. 7 schematically shows a sixth embodiment of the invention.

With reference to the drawing, this embodiment basically has the same construction as the ZnS MIS-type device described above except that the second conductive layer 131 has a trapezoidal section and a thickness which decreases at its opposite ends toward the direction of its width.

In this case, a low-resistance n-type ZnS layer and a low-resistance $ZnS_xSe_{1-x}$ (to be formed into the second layer 131) are successively epitaxially grown over a low-resistance n-type ZnS substrate 1, the latter layer is then etched to form the trapezoidal layer 131, and low-resistance n-type ZnS is epitaxially grown again to complete a first conductive layer 2.

With this structure, the second conductive layer 131 has a higher refractive index than the first conductive layer 2. The light incident on each end portion of the second conductive layer 131 where the interface between the two layers 2, 131 is inclined with respect to the light-emitting layer 4 is refracted toward the center. The light emanating from the light-emitting layer 4 can therefore be converged toward the substrate 1. This achieves a greatly improved delivery efficiency.

The present embodiment realizes ZnS MIS-type or p-n junction electroluminescent devices exhibiting a further improved delivery efficiency.

The second conductive layers of the devices according to the third, fourth and fifth embodiments can be made trapezoidal as is the case with the present embodiment, whereby a converging property can be given to the light emanating from the light-emitting layer, thereby enabling the device to deliver the light efficiently.

Figure 8:
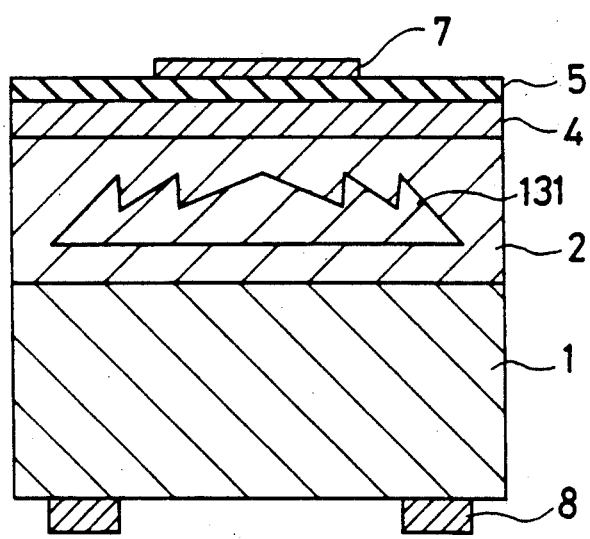

FIG. 8 shows a seventh embodiment of the invention.

With reference to FIG. 8, the second conductive layer 131 of this embodiment is in the form of a Fresnel lens, which gives a high converging property and high directionality to the light produced by the light-emitting layer 4. The device fabricated is therefore adapted to deliver the light toward the desired direction with a high efficiency.

Thus, the foregoing first to seventh embodiments realize efficient compound semiconductor electroluminescent devices which are greatly improved in the convergence and directionality of light and light delivery efficiency and which are very useful as light sources for various optoelectronic apparatus such as high-brightness blue electroluminescent displays for use in displaying and processing data.

What is claimed is:

1. An electroluminescent device of compound semiconductor which comprises an electroluminescent device body formed on a substrate and providing a light-emitting portion and a conductive portion joined to the lower surface and/or the upper surface of the light-emitting portion, and a pair of electrodes for applying therethrough an external voltage to the body to cause electroluminescence, the conductive portion comprising a conductive layer formed of a Group II - VI compound semiconductor made to have a substantially low resistance by the addition of an impurity element, and a conductive layer part provided in the conductive layer and formed of a Group II - VI compound semiconductor having a higher refractive index than the Group II - VI compound semiconductor of the conductive layer and containing an impurity element added thereto, the conductive layer part being so shaped as to confine thereto the light produced by the light-emitting portion.

2. A device as defined in claim 1 wherein the Group II - VI compound semiconductor forming the conductive layer is ZnS having a refractive index of 2.4, and the Group II - VI compound semiconductor forming the conductive layer part is $ZnS_xSe_{1-x}$ ($x \leq 0.5$), the conductive layer and the conductive layer part containing the same impurity compound.

3. A device as defined in claim 1 wherein the Group II - VI compound semiconductor forming the conductive layer is $ZnS_ySe_{1-y}$ ($y \geq 0.5$), and the Group II - VI compound semiconductor forming the conductive layer part is ZnSe having a refractive index of 2.7, the conductive layer and the conductive layer part containing the same impurity element.

4. A device as defined in claim 1 wherein the Group II - VI compound semiconductor forming the conductive layer is $ZnS_jSe_{1-j}$ and the Group II - VI compound semiconductor forming the conductive layer part is $ZnS_kSe_{1-k}$ ($j > k+0.5$), the conductive layer and the conductive layer part containing the same impurity element.

5. A device as defined in claim 1 wherein the Group II - VI compound semiconductor forming the conductive layer is ZnS, and the Group II - VI compound semiconductor forming the conductive layer part is $ZnS_xSe_{1-x}$ ($x < 0.5$) which has an S content/Se content ratio varying continuously or stepwise from each of the upper and lower interfaces between the conductive layer and the conductive layer part toward the center of said part widthwise thereof, the conductive layer part having the highest refractive index at its center, the conductive layer and the conductive layer part containing the same impurity element.

6. A device as defined in claim 1 wherein the substrate is made of a conductive ZnS, ZnSe or $ZnS_xSe_{1-x}$.

7. A device as defined in claim 1 wherein the substrate is made of an insulating ZnS, ZnSe or $ZnS_xSe_{1-x}$.

8. A device as defined in claim 1 wherein the light-emitting portion is a luminescent layer of the MIS (metal insulator semiconductor) type formed of ZnS or ZnSe having an impurity element added thereto.

9. A device as defined in claim 1 wherein the light-emitting portion is a luminescent layer of planar structure having a p-n junction formed by the combination of ZnS having a p-type impurity element added thereto and ZnS having an n-type impurity element added thereto.

10. A device as defined in claim 1 wherein the light-emitting portion is a luminescent layer of planar structure having a p-n junction formed by the combination of ZnSe having a p-type impurity element added thereto and ZnSe having an n-type impurity element added thereto.

11. A device as defined in claim 1 wherein the conductive layer part is in the form of a solid cylinder.

12. A device as defined in claim 1 wherein the conductive layer part is in the form of a convex lens.

13. A device as defined in claim 1 wherein the conductive layer part is trapezoidal in section.

14. A device as defined in claim 1 wherein the conductive layer part is in the form of a Fresnel lens.

15. A device as defined in claim 1 wherein the conductive portion and the light-emitting portion are identical in shape when seen in a plane view, and the conductive layer having the conductive layer part is formed on the substrate, the light-emitting portion being formed on the conductive layer and on the substrate with an electrode forming space left locally on the upper surface of the conductive layer, the pair of electrodes being connected to the conductive layer and the light-emitting portion respectively.

16. A device as defined in claim 10 or 15 wherein the substrate is an insulating substrate of $ZnS_xSe_{1-x}$ and the device body comprises a conductive layer of $ZnS_ySe_{1-y}$ containing an n-type impurity element added thereto and having a conductive layer part of ZnSe with an n-type impurity element added thereto, a light-emitting layer of ZnSe having an n-type impurity element added thereto and a light-emitting layer of ZnSe having a p-type impurity element added thereto, the component layers of the device body being formed on the substrate one over another in the order mentioned, one of the electrodes being made of Au and provided on the p-type light-emitting layer, the other electrode being made of In and provided on the conductive layer.

17. A device as defined in claim 10 or 15 wherein the substrate is an insulating substrate of ZnSe, and the device body comprises a conductive layer of ZnSe having a p-type impurity element added thereto, a light-emitting layer of ZnSe having a p-type impurity element added thereto, a light-emitting layer of ZnSe having an n-type impurity element added thereto, and a conductive layer of $ZnS_ySe_{1-y}$ containing an n-type impurity element added thereto and having a conductive layer part of $ZnS_kSe_{1-k}$ with an n-type impurity element added thereto, the component layers of the device body being formed on the substrate one over another in the order mentioned, one of the electrodes being made of Au and provided on the lowermost conductive layer, the other electrode being made of In and provided on the uppermost conductive layer.

18. A device as defined in claim 1 wherein one of the electrodes is connected to the device body, and the other electrode is connected to one surface of the substrate opposite to the other surface thereof having the device body formed thereon.

19. A device as defined in claim 8 or 18 wherein the substrate is made of ZnS having an n-type impurity element added thereto, and the device body comprises a conductive layer of ZnS containing an n-type impurity element added thereto and having a conductive layer part of $ZnS_xSe_{1-x}$ with an n-type impurity element added thereto, a light-emitting layer of ZnS having an n-type impurity element added thereto and an insulating layer of ZnS, the component layers of the device body being formed on the substrate one over another in the order mentioned, one of the electrodes being made of Au and provided on the insulating layer, the other electrode being made of In and provided on one surface of the substrate opposite to the other surface thereof having the device body formed thereon.

20. A device as defined in claim 1 wherein the light-emitting portion is a luminescent layer of planar structure having a p-n junction formed by the combination of $ZnS_xSe_{1-x}$ having a p-type impurity element added thereto and $ZnS_ySe_{1-y}$ having an n-type impurity element added thereto.

21. A device as defined in claim 1 wherein the light-emitting portion is a luminescent layer of planar structure having a p-n junction formed by the combination of $ZnS_xTe_{1-x}$ having a p-type impurity element added thereto and $ZnS_yTe_{1-y}$ having an n-type impurity element added thereto.

* * * * *